(12) United States Patent
Nii

(10) Patent No.: US 6,493,256 B1
(45) Date of Patent: Dec. 10, 2002

(54) SEMICONDUCTOR MEMORY DEVICE

(75) Inventor: Koji Nii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/109,814

(22) Filed: Apr. 1, 2002

(30) Foreign Application Priority Data

May 31, 2001 (JP) ........................................ 2001-164313
Aug. 31, 2001 (JP) ........................................ 2001-263356

(51) Int. Cl.[7] ............................................. G11C 11/00
(52) U.S. Cl. ...................................... 365/154; 365/156
(58) Field of Search .................................. 365/154, 156

(56) References Cited

U.S. PATENT DOCUMENTS 5,592,414 A * 1/1997 Soneda et al. ............... 365/156
6,388,936 B2 * 5/2002 Itoh et al. .................... 365/154

FOREIGN PATENT DOCUMENTS

JP 58-27917 6/1983

* cited by examiner

*Primary Examiner*—Huan Hoang
(74) *Attorney, Agent, or Firm*—Oblon, Spivak, McClelland, Maier & Neustadt, P.C.

(57) ABSTRACT

A gate of an NMOS transistor (N1) is connected to a memory terminal (Na) and a gate of an NMOS transistor (N2) is connected to a memory terminal (Nb). Sources of the NMOS transistors (N1, N2) are commonly connected to an internal terminal (Nc) and a ground potential (GND). Potentials of backgate terminals (BN1, BN2) of the NMOS transistors (N1, N2) are set to the ground potential (GND). When PMOS transistors (P1, P2) are in ON and OFF states, respectively, the memory terminal (Na) is brought into a logical "H" state and the memory terminal (Nb) remains a logical "L" state by a gate-leak current passing from the gate of the NMOS transistor (N2) to a semiconductor substrate. With such a structure, a semiconductor memory device having a memory cell structure to ensure reduction in cell area can be achieved.

20 Claims, 8 Drawing Sheets

F I G. 1
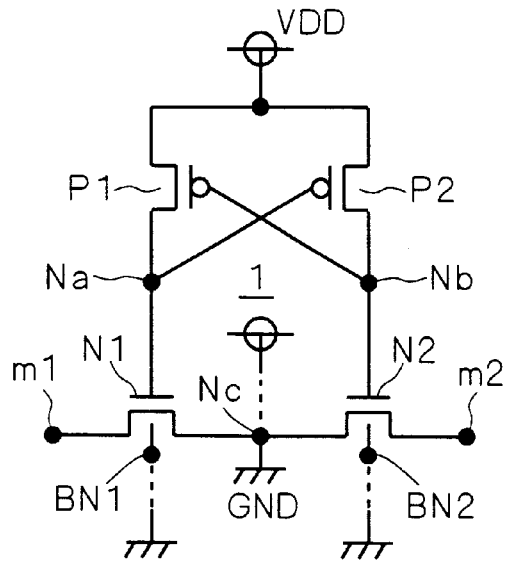
F I G. 2
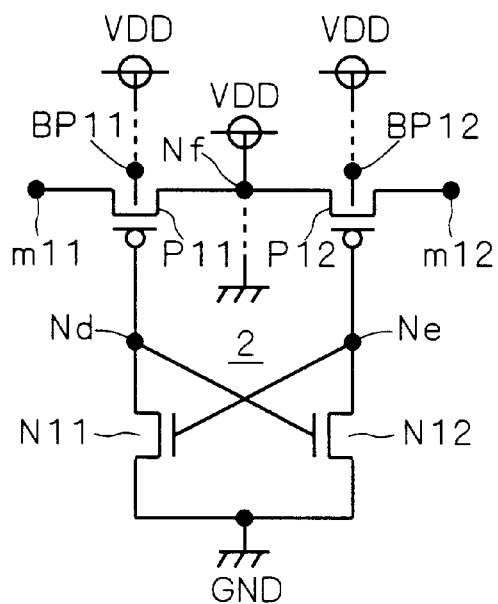

F I G. 3
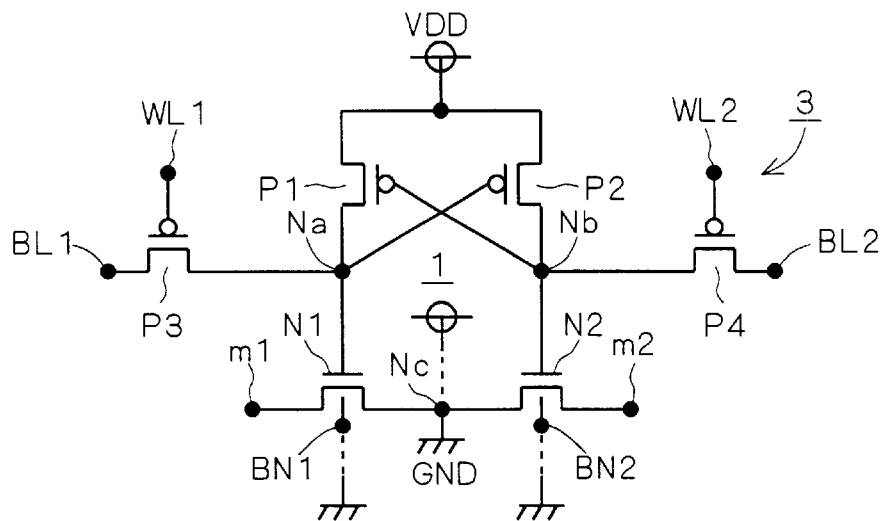
F I G. 4
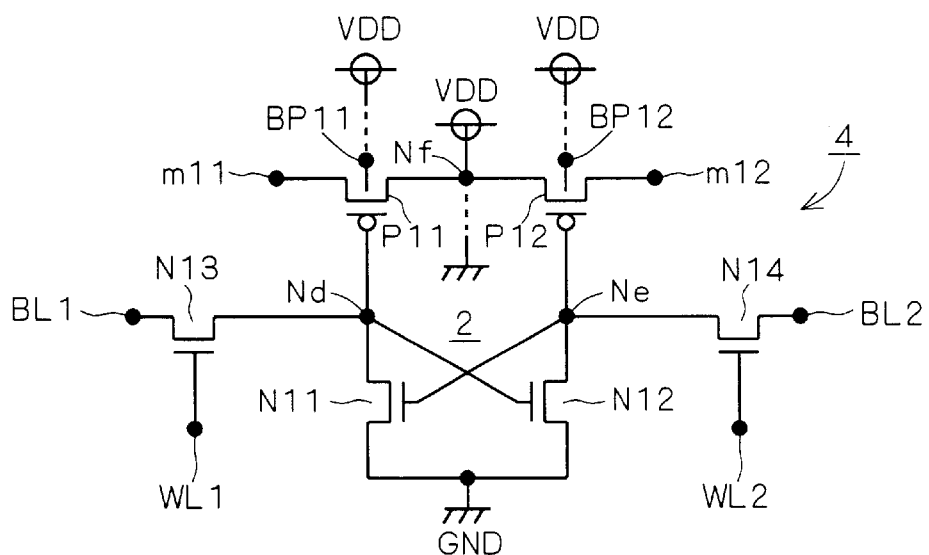

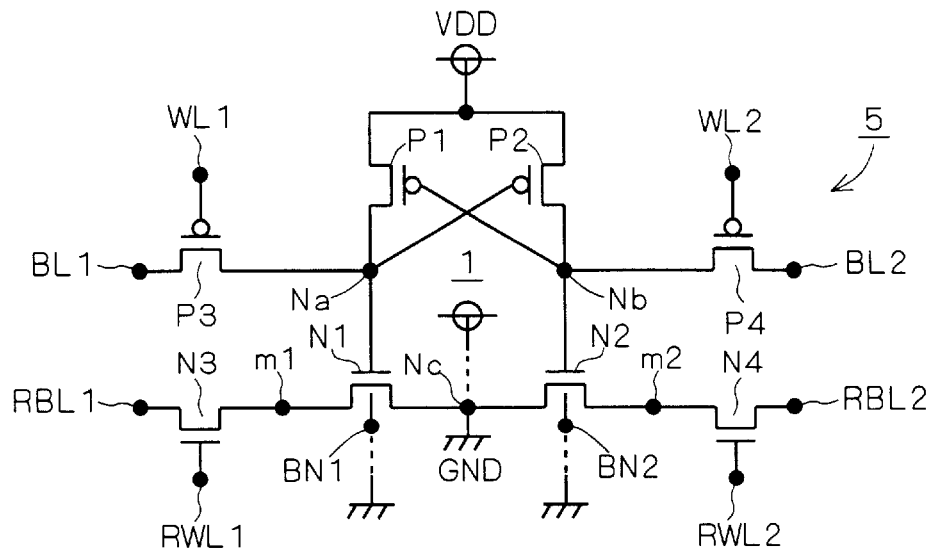
F I G. 5
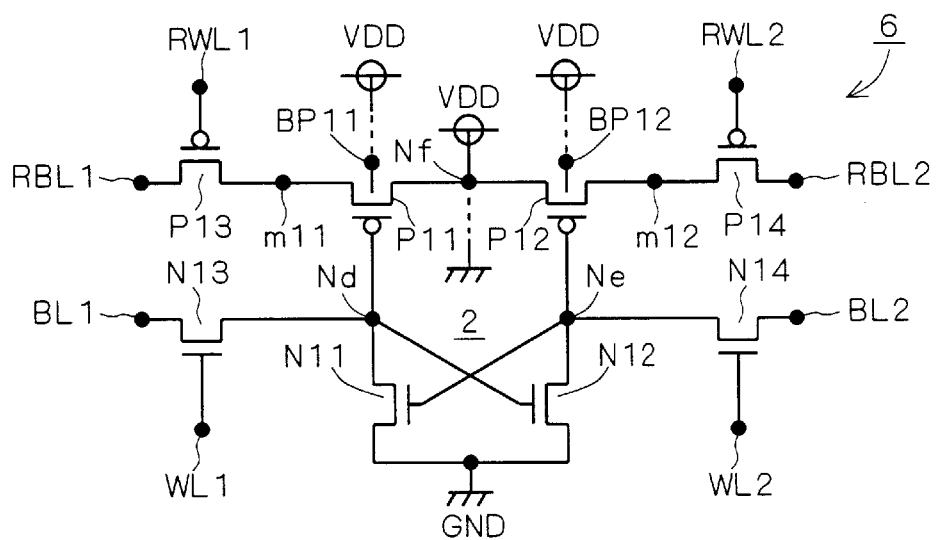
F I G. 6

F I G. 1 1
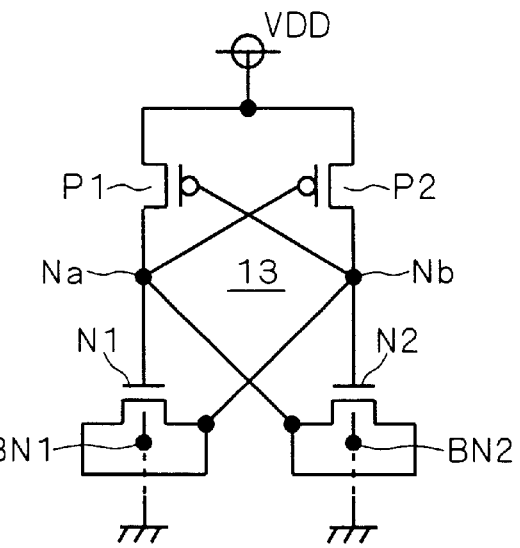
F I G. 1 2
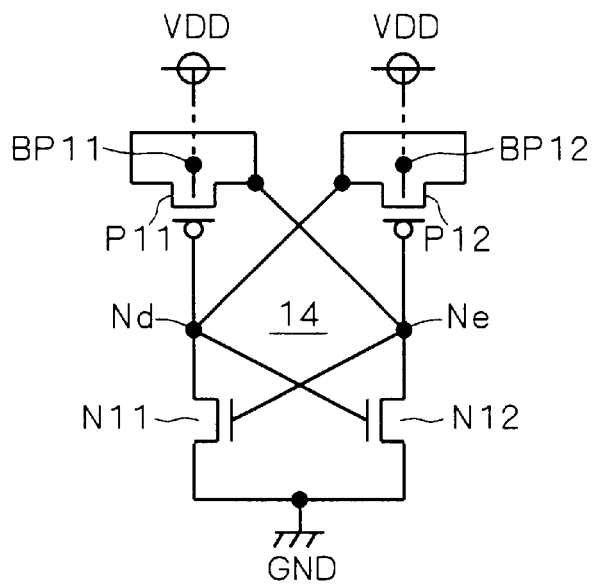

US 6,493,256 B1

SEMICONDUCTOR MEMORY DEVICE

BACKGROUND OF THE INVENTION

1. Field of the Invention

The present invention relates to a semiconductor memory device, and more particularly to a memory cell structure of a CMOS static RAM.

2. Description of the Background Art

FIG. 15 is a circuit diagram showing an exemplary memory cell (memory circuit) of multiport memory in the background art, e.g., disclosed in Japanese Patent Publication No. 58-27917 (FIG. 4).

As shown in FIG. 15, PMOS transistors PI1 and PI2 and NMOS transistors NI1 and NI2 constitute a memory cell storage unit 9. Sources of the PMOS transistors PI1 and PI2 are connected to a power supply VDD, and sources of the NMOS transistors NI1 and NI2 are connected to a ground potential GND. Drains of the PMOS transistor PI1 and the NMOS transistor NI1 and gates of the PMOS transistor PI2 and the NMOS transistor NI2 are commonly connected to a memory terminal 21, and drains of the PMOS transistor PI2 and the NMOS transistor NI2 and gates of the PMOS transistor PI1 and the NMOS transistor NI1 are commonly connected to a memory terminal 22.

Specifically, a first CMOS inverter consisting of the PMOS transistor PI1 and the NMOS transistor NI1 and a second CMOS inverter consisting of the PMOS transistor PI2 and the NMOS transistor NI2 are cross-connected, to form the memory cell storage unit 9.

A drain of an access (NMOS) transistor NA1 is connected to the memory terminal 21. A bit line BL1 is connected to a source of an access transistor N1 and a word line WL1 is connected to a gate thereof. A drain of an access (NMOS) transistor NA2 is connected to the memory terminal 22. A bit line BL2 is connected to a source of an access transistor N2 and a word line WL2 is connected to a gate thereof.

Further, gates of NMOS transistors N21 and N22 are connected to the memory terminals 21 and 22, respectively, and sources thereof are commonly connected the ground potential GND. Sources of NMOS transistors N23 and N24 are connected to drains of the NMOS transistors N21 and N22, respectively. A read word line RWL1 and a read bit line RBL1 are connected to a gate and a drain of the NMOS transistor N23, respectively, and a read word line RWL2 and a read bit line RBL2 are connected to a gate and a drain of the NMOS transistor N24, respectively.

With respect to this structure, an operation of the memory cell storage unit 9 of multiport memory in the background art shown in FIG. 15 will be discussed. The memory terminals 21 and 22 have a complementary relation, and for example, when the memory terminal 21 is in a logical "H" state, the memory terminal 22 comes into a logical "L" state, being stable. Conversely, when the memory terminal 21 is in the logical "L" state, the memory terminal 22 comes into the logical "H" state, being stable. Thus, this structure can hold stored data of the two stable states, depending on whether the states of the memory terminals 21 and 22 are "H" or "L".

If the memory terminal 21 is stable in the logical "H" state (in other words, the memory terminal 22 is in the logical "L" state), the PMOS transistor pI1 is in an ON state and the PMOS transistor PI2 is in an OFF state. Further, the NMOS transistor NI1 is in the OFF state and the NMOS transistor NI2 is in the ON state.

Next, a read/write operation using the word line WL1 (WL2) and the bit line BL1 (BL2) will be discussed. When the word line WL1 is in the "L" state, the transistor NA1 is in the OFF state, and the memory terminal 21 is electrically cut off with the bit line BL1 which corresponds to a read/write terminal for data. In other words, the stored data is held. When the word line WL1 is brought into the "H" state from the "L" state in response to an external signal, the transistor NA1 comes into the ON state from the OFF state and the memory terminal 21 electrically gets connected to the bit line BL1.

In this case, if the bit line BL1 is not externally driven, the data of the memory terminal 21 is propagated to the bit line BL1 through the transistor NA1 and read out. Thus performed is a read operation in the read/write operation.

On the other hand, when the word line WL1 is in the "H" state, if the bit line BL1 is strongly driven into the "L" or "H" state by a not-shown external circuit, the data of the bit line BL1 which is driven is propagated to the memory terminal 21 through the transistor NA1 and data of the memory terminal 21 is rewritten by the data of the bit line BL1. Thus performed is a write operation in the read/write operation.

When the word line WL1 is returned to the "L" state from the "H" state by an external signal, the memory terminal 21 comes into a hold-mode again. An operation of a port on the side of the transistor NA2 connected to the memory terminal 22 is the same as the above operation and therefore not discussed herein.

Next, a read operation using the read word line RWL1 (RWL2) and the read bit line RBL1 (RBL2) will be discussed. When the read word line RWL1 is in the "L" state, the NMOS transistor N23 is in the OFF state, and a read terminal m1 is electrically cut off with the read bit line RBL1. In an initial state, the read bit line RBL1 is precharged in the "H" state by a not-shown precharge circuit.

When the read word line RWL1 is brought into the "H" state from the "L" state in response to an external signal, the NMOS transistor N23 comes into the ON state from the OFF state and the memory terminal m1 electrically gets connected to the read bit line RBL1. If the hold-mode of the memory terminal 21 is "H", the NMOS transistor N21 is in the ON state and the read bit line RBL1 electrically gets connected to the ground potential GND through the NMOS transistors N23 and N21. Therefore, the read bit line RBL1 is brought into the "L" state from the "H" state and data of "L" which is inverted data of the memory terminal 21 is read out.

Conversely, if the hold-mode of the memory terminal 21 is "L", the NMOS transistor N21 is in the OFF state and the read bit line RBL1 is electrically cut off with the ground potential GND. Therefore, the read bit line RBL1 remains the "H" state and data of "H" which is inverted data of the memory terminal 21 is read out. When the read word line RWL1 is returned to the "L" state from the "H" state by an external signal, the memory terminal m1 gets cut off with the read bit line RBL1 again and the read bit line RBL1 is precharged into the "H" state again for the next read operation. Further, the read bit line RBL1 and the memory terminal 21 are not electrically connected to each other and no write operation is performed by the NMOS transistor N23. A read operation of a port on the side of the NMOS transistor N24 connected to another memory terminal m2 is the same as the above operation and therefore not discussed.

As discussed above, the memory cell including the memory cell storage unit 9 of multiport memory in the background art shown in FIG. 15 has a structure comprising two ports for reading and writing and two ports for only reading. FIG. 15 shows a four-port memory cell consisting of totally ten MOS transistors, i.e., eight NMOS transistors and two PMOS transistors.

The four-port memory cell is constituted of ten transistors as shown in FIG. 15, and in the structure of a multiport memory cell, like this example, the number of transistors constituting the multiport memory cell increases depending on the number of ports and this disadvantageously results in enlargement of cell area.

SUMMARY OF THE INVENTION

The present invention is directed to a semiconductor memory device. According to a first aspect of the present invention, the semiconductor memory device has a memory cell storage unit for data storage formed in a semiconductor substrate. The memory cell storage unit of the first aspect comprises first and second MIS transistors both of a first conductivity type, one electrode of the first MIS transistor and one electrode of the second MIS transistor being commonly connected to a first power supply, the other electrode of the first MIS transistor and the other electrode of the second MIS transistor serving as first and second memory terminals, respectively, the first and second memory terminals being connected to control electrodes of the second and first MIS transistors, respectively, and the first and second memory terminals each being set to a first power supply judged-potential that can be judged as a potential on the side of the first power supply when the first and second MIS transistors are in an ON state, and the memory cell storage unit of the first aspect further comprises third and fourth MIS transistors both of a second conductivity type, one electrode of the third MIS transistor and one electrode of the fourth MIS transistor being connected to each other, control electrodes of the third and fourth MIS transistors being connected to the first and second memory terminals, respectively, the other electrode of the third MIS transistor and the other electrode of the fourth MIS transistor being independent of the first and second memory terminals, and backgate terminals of the third and fourth MIS transistors for setting a substrate potential being connected to a second power supply, and in the semiconductor memory device of the first aspect, the first to fourth MIS transistors are provided so that a potential of the first memory terminal is stable at a second power supply judged-potential that can be judged as a potential on the side of the second power supply when the first MIS transistor is in an OFF state and a potential of the second memory terminal is stable at the second power supply judged-potential when the second MIS transistor is in the OFF state.

According to a second aspect of the present invention, the semiconductor memory device has a memory cell storage unit for data storage formed in a semiconductor substrate. The memory cell storage unit of the second aspect comprises first and second MIS transistors both of a first conductivity type, one electrode of the first MIS transistor and one electrode of the second MIS transistor being commonly connected to a first power supply, the other electrode of the first MIS transistor and the other electrode of the second MIS transistor serving as first and second memory terminals, respectively, the first and second memory terminals being connected to control electrodes of the second and first MIS transistors, respectively, and the first and second memory terminals each being set to a first power supply judged-potential that can be judged as a potential on the side of the first power supply when the first and second MIS transistors are in an ON state, and the memory cell storage unit of the second aspect further comprises third and fourth MIS transistors both of a second conductivity type, one electrode of the third MIS transistor and one electrode of the fourth MIS transistor not being fixed to any potential, control electrodes of the third and fourth MIS transistors being connected to the first and second memory terminals, respectively, the other electrode of the third MIS transistor and the other electrode of the fourth MIS transistor being connected to the second and first memory terminals, and backgate terminals of the third and fourth MIS transistors for setting a substrate potential being connected to a second power supply, and in the semiconductor memory device of the second aspect, the first to fourth MIS transistors are provided so that a potential of the first memory terminal is stable at a second power supply judged-potential that can be judged as a potential on the side of the second power supply when the first MIS transistor is in an OFF state and a potential of the second memory terminal is stable at the second power supply judged-potential when the second MIS transistor is in the OFF state.

According to a third aspect of the present invention, in the semiconductor memory device of the first aspect, assuming that currents flowing between one electrode and the other electrode of the first MIS transistor in the OFF state are first off-leak currents, currents flowing between one electrode and the other electrode of the second MIS transistor in the OFF state are second off-leak currents, currents flowing between the control electrode of the first MIS transistor and the semiconductor substrate are first gate-leak currents, currents flowing between the control electrode of the second MIS transistor and the semiconductor substrate are second gate-leak currents, currents flowing between the control electrode of the third MIS transistor and the semiconductor substrate are third gate-leak currents and currents flowing between the control electrode of the fourth MIS transistor and the semiconductor substrate are fourth gate-leak currents, the first to fourth MIS transistors are provided so that the amount of the third gate-leak currents is not less than the total amount of the first off-leak currents and the second gate-leak currents during a period until at least the potential of the first memory terminal becomes the second power supply judged-potential and the amount of the fourth gate-leak currents is not less than the total amount of the second off-leak currents and the first gate-leak currents during a period until at least the potential of the second memory terminal becomes the second power supply judged-potential.

According to a fourth aspect of the present invention, in the semiconductor memory device of the first aspect, one electrode of the third MIS transistor and one electrode of the fourth MIS transistor are set to a fixed potential.

According to a fifth aspect of the present invention, the semiconductor memory device of the first aspect further comprises a first access transistor having one electrode connected to an access memory terminal which is one of the first and second memory terminals, the other electrode connected to a write/read line and a control electrode connected to a write/read control line.

According to a sixth aspect of the present invention, in the semiconductor memory device of the fifth aspect, the write/read line includes first and second write/read lines, and the first access transistor includes a fifth MIS transistor having one electrode connected to the first memory terminal and the other electrode connected to the first write/read line; and a sixth MIS transistor having one electrode connected to the second memory terminal and the other electrode connected to the second write/read line.

According to a seventh aspect of the present invention, in the semiconductor memory device of the sixth aspect, the write/read control line includes first and second write/read control lines, the fifth MIS transistor has a control electrode connected to the first write/read control line, and the sixth MIS transistor has a control electrode connected to the second write/read control line.

According to an eighth aspect of the present invention, in the semiconductor memory device of the fourth aspect, the third and fourth MIS transistors include a MIS transistor which turns on/off when the potentials of the first and second memory terminals are the first/second power supply judged-potentials, respectively, and the other electrodes of the third and fourth MIS transistors are defined as first and second read terminals, respectively, and the semiconductor memory device of the eighth aspect further comprises: a second access transistor having one electrode connected to an access read terminal which is one of the first and second read terminals, the other electrode connected to a read only line and a control electrode connected to a read only control line.

According to a ninth aspect of the present invention, in the semiconductor memory device of the eighth aspect, the read only line includes first and second read only lines, and the second access transistor includes a seventh MIS transistor having one electrode connected to the first read terminal and the other electrode connected to the first read only line; and an eighth MIS transistor having one electrode connected to the second read terminal and the other electrode connected to the second read only line.

According to a tenth aspect of the present invention, in the semiconductor memory device of the ninth aspect, the read only control line includes first and second read only control lines, the seventh MIS transistor has a control electrode connected to the first read only control line, and the eighth MIS transistor has a control electrode connected to the second read only control line.

According to an eleventh aspect of the present invention, in the semiconductor memory device of the fourth aspect, the other electrodes of the third and fourth MIS transistors are defined as first and second read terminals, respectively, and the semiconductor memory device of the eleventh aspect further comprises: a seventh MIS transistor having one electrode connected to the first read terminal, the other electrode connected to a comparison judgment line and a control electrode connected to a first comparison judgment control line; and an eighth MIS transistor having one electrode connected to the second read terminal, the other electrode connected to the comparison judgment line and a control electrode connected to a second comparison judgment control line.

According to a twelfth aspect of the present invention, the semiconductor memory device of the first aspect further comprises: a seventh MIS transistor having one electrode connected to a comparison judgment line, the other electrode set to a fixed potential and a control electrode connected to one electrode of the third MIS transistor and one electrode of the fourth MIS transistor; and first and second comparison judgment control lines connected to the other electrodes of the third and fourth MIS transistors, respectively.

Preferably, in the semiconductor memory device of the fourth aspect, the fixed potential includes a potential of one of the first and second power supplies.

Preferably, in the semiconductor memory device of the first aspect, the first conductivity type includes a P-type conductivity, the second conductivity type includes an N-type conductivity, and a potential of the first power supply is higher than that of the second power supply.

Preferably, in the semiconductor memory device of the first aspect, the first conductivity type includes an N-type conductivity, the second conductivity type includes a P-type conductivity, and a potential of the first power supply is lower than that of the second power supply.

Preferably, in the semiconductor memory device of the second aspect, one electrode of the third MIS transistor and one electrode of the fourth MIS transistor are connected to each other.

Preferably, in the semiconductor memory device of the second aspect, one electrode and the other electrode of the third MIS transistor are connected to each other, and one electrode and the other electrode of the fourth MIS transistor are connected to each other.

Preferably, in the semiconductor memory device of the second aspect, one electrode of the third MIS transistor and one electrode of the fourth MIS transistor are in a floating state.

Preferably, in the semiconductor memory device of the second aspect, the first conductivity type includes a P-type conductivity, the second conductivity type includes an N-type conductivity, and a potential of the first power supply is higher than that of the second power supply.

Preferably, in The semiconductor memory device of the second aspect, the first conductivity type includes an N-type conductivity, the second conductivity type includes a P-type conductivity, and a potential of the first power supply is lower than that of the second power supply.

In the semiconductor memory device of the first aspect of the present invention, the first to fourth MIS transistors are provided so that the potential of the first memory terminal can be stable at the second power supply judged-potential when the first MIS transistor is in the OFF state and the potential of the second memory terminal can be stable at the second power supply judged-potential when the second MIS transistor is in the OFF state.

Accordingly, when either one of the first and second MIS transistors is made the ON state and the other is made the OFF state, one of the first and second memory terminals is set to the first power supply judged-potential through the first or second MIS transistor which is in the ON state and the other is set to the second power supply judged-potential as discussed above, whereby information storage is performed between the first and second memory terminals.

As a result, since the memory cell storage unit needs a cross connection of only the first and second MIS transistors and that allows a simple layout, a semiconductor memory device having a memory cell structure to ensure reduction in cell area can be provided.

According to the second aspect of the present invention, a semiconductor memory device having a memory cell structure which ensures reduction in cell area, like that of the first aspect, can be achieved.

Further, since the other electrodes of the third and fourth MIS transistors are connected to the second and first memory terminals, respectively, it is possible to improve the soft-error resistance by addition of capacitance between the other electrodes and the control electrodes of the third and fourth MIS transistors to the second and first memory terminals.

In the semiconductor memory device of the third aspect of the present invention, by providing the third and fourth MIS transistors so that the third and fourth gate-leak currents can satisfy the above condition, the potentials of the first and second memory terminals are always set to the second power supply judged-potential when the first and second MIS transistors are in the OFF state, whereby information storage can be performed between the first and second memory terminals.

In the semiconductor memory device of the fourth aspect of the present invention, if the third and fourth MIS transistors are set to turn on/off when the potentials of the first and second memory terminals are set to the first/second power supply judged-potential by setting one electrode of the third MIS transistor and one electrode of the fourth MIS transistor are set to fixed potentials, the stored content in the memory cell storage unit can be read out by utilizing whether the potential obtained by the other electrodes of the third and fourth MIS transistors are fixed potentials or not.

The semiconductor memory device of the fifth aspect of the present invention can perform a write operation by turning on the first access transistor by the write/read control line to set the potential of the access memory terminal while setting the potential of the write/read line and a read operation by turning on the first access transistor by the write/read control line to read the potential of the access memory terminal out to the write/read line.

The semiconductor memory device of the sixth aspect of the present invention can perform write/read operations on the respective two ports by utilizing the fifth and sixth MIS transistors. Further, a write operation is performed by setting such data on the first and second write/read lines as to have a complementary relation and a read operation is performed on the basis of the potential difference between the first and second write/read lines, and therefore a stable write/read operation can be achieved.

The semiconductor memory device of the seventh aspect of the present invention can perform write/read operations independent of each other on the respective two ports by the first and second write/read control lines.

In the semiconductor memory device of the eighth aspect of the present invention, since the potential of the read only line is set to a potential different from the fixed potential and thereafter the second access transistor is turned on by the read only line, a read operation can be performed on the basis of whether the potential of the read only line is the fixed potential or not.

The semiconductor memory device of the ninth aspect of the present invention can perform write/read operations on the respective two ports by utilizing the seventh and eighth MIS transistors. Further, a read operation is performed on the basis of the potential difference between the first and second read only lines. Therefore, a stable read operation can be achieved.

The semiconductor memory device of the tenth aspect of the present invention can perform write/read operations independent of each other on the respective two ports by the first and second read only control lines.

In the semiconductor memory device of the eleventh aspect of the present invention, since the potential of the comparison judgment line is set to a potential different from the fixed potential and thereafter one of the seventh and eighth MIS transistors is made the ON state and the other is made the OFF state by the first and second comparison judgment control lines, a comparison operation for checking if the data- stored in the memory cell storage unit and the search data match each other on the basis of whether the potential of the comparison judgment line is the fixed potential or not.

In the semiconductor memory device of the twelfth aspect of the present invention, since the potential of the comparison judgment line is set to a potential different from the fixed potential and thereafter one of the first and second comparison judgment control lines and the other are set to the potentials to turn on and off the seventh MIS transistor, respectively, a comparison operation for checking if the data stored in the memory cell storage unit and the search data match each other on the basis of whether the potential of the comparison judgment line is the fixed potential or not.

An object of the present invention is to provide a semiconductor memory device having a memory cell structure which ensures reduction in cell area.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a structure of a memory cell storage unit in an SRAM in accordance with a first preferred embodiment of the present invention;

FIG. 2 is a circuit diagram showing a structure of a memory cell storage unit in an SRAM in accordance with a second preferred embodiment of the present invention;

FIG. 3 is a circuit diagram showing a structure of a memory cell in an SRAM in accordance with a third preferred embodiment of the present invention;

FIG. 4 is a circuit diagram showing a structure of a memory cell in an SRAM in accordance with a fourth preferred embodiment of the present invention;

FIG. 5 is a circuit diagram showing a structure of a memory cell in an SRAM in accordance with a fifth preferred embodiment of the present invention;

FIG. 6 is a circuit diagram showing a structure of a memory cell in an SRAM in accordance with a sixth preferred embodiment of the present invention;

FIG. 11 is a circuit diagram showing a structure of a memory cell storage unit in an SRAM in accordance with an eleventh preferred embodiment of the present invention;

FIG. 12 is a circuit diagram showing a structure of a memory cell storage unit in an SRAM in accordance with a twelfth preferred embodiment of the present invention;

DESCRIPTION OF THE PREFERRED EMBODIMENTS

<The First Preferred Embodiment>

Figure 7:
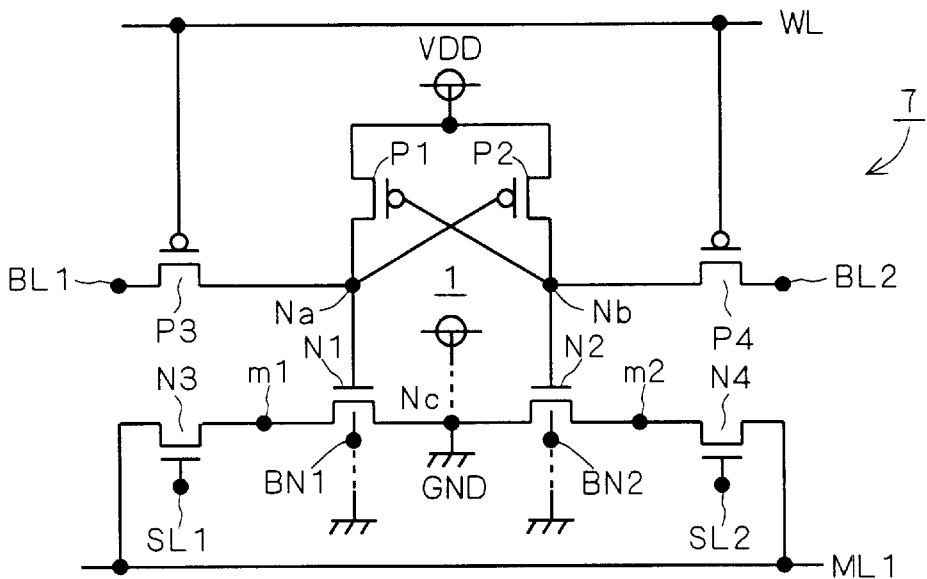
FIG. 7 is a circuit diagram showing a structure of a memory cell in an SRAM in accordance with a seventh preferred embodiment of the present invention.

FIG. 1 is a circuit diagram showing a structure of a memory cell storage unit in an SRAM in accordance with the first preferred embodiment of the present invention. A memory cell storage unit 1 shown in FIG. 1 is formed in a semiconductor substrate.

As shown in FIG. 1, sources of PMOS transistors P1 and P2 are connected to the power supply VDD. A drain of the PMOS transistor P1, a gate of the PMOS transistor P2 and a gate of an NMOS transistor N1 are commonly connected to a memory terminal Na. Further, a drain of the PMOS transistor P2, a gate of the PMOS transistor P1 and a gate of an NMOS transistor N2 are commonly connected to another memory terminal Nb. Sources of the NMOS transistors N1 and N2 are commonly connected to an internal terminal Nc. The internal terminal Nc is connected to the ground potential GND. In this case, the internal terminal Nc may be connected to the power supply VDD. Drains of the NMOS transistors N1 and N2 can serve as read connection terminals m1 and m2, respectively.

Potentials at backgate terminals BN1 and BN2 of the NMOS transistors N1 and N2 for setting a substrate potential are set to the ground potential GND. The substrate potential is equivalent to a potential of a P well region (P substrate) for forming the drain and source regions in a bulk silicon wafer and equivalent to that of a P-type body region which is to become a SOI layer between the source and drain regions in a SOI substrate.

In the NMOS transistor, though the substrate potential is set to the ground potential GND as shown in FIG. 1, no particular problem rises when the substrate potential is externally set to another potential (e.g., one lower than the set potential GND). In a case of fixing a body potential, the substrate potential is connected to the ground potential GND or an arbitrary potential, like in a bulk silicon wafer. With the above connection, the memory cell storage unit 1 of the first preferred embodiment is achieved.

Next, an operation of the memory cell storage unit 1 of FIG. 1 will be discussed. The memory terminals Na and Nb have a complementary relation, and for example, when the memory terminal Na is in the logical "H" state, the memory terminal Nb comes into the logical "L" state, being stable. Conversely, when the memory terminal Na is in the logical "L" state, the memory terminal Nb comes into the logical "H" state, being stable. Thus, this structure can hold stored data with two stable states, depending on whether the states of the memory terminals Na and Nb are "H" or "L".

If the memory terminal Na is stable in the logical "H" state (the memory terminal Nb is in the logical "L" state), the PMOS transistor P1 is in the ON state and the PMOS transistor P2 is in the OFF state. The NMOS transistor N1 is in the ON state and the NMOS transistor N2 is in the OFF state.

With size reduction, there is a tendency for a gate insulating film of a MOS transistor to become thinning in film thickness and the insulation is reaching its limit. Accordingly, the level of a gate-leak current flowing between a gate and a semiconductor substrate is becoming appreciable. The appreciable level of gate-leak current refers to the amount of currents almost equivalent to, e.g., an off-leak current flowing between a source and a drain in the OFF state.

With the thinned gate insulating film of the MOS transistor, the gate-leak current flows from the gate of the NMOS transistor N1 to the semiconductor substrate, but since the PMOS transistor P1 is in the ON state, the memory terminal Na is electrically connected to the power supply VDD to hold the logical "H" state (the first power supply judged-potential that can be judged as a potential on the side of the power supply VDD).

On the other hand, since the PMOS transistor P2 is in the OFF state, the memory terminal Nb is electrically cut off with the VDD potential to hold the logical "L" state (the second power supply judged-potential that can be judged as a potential on the side of the ground potential GND) with the gate-leak current flowing from the gate of the NMOS transistor N2 to the semiconductor substrate.

Further, in order to stably hold the data of logical "L" at the memory terminal Na, it is desirable that at least during a period while the memory terminal Na is stable in the logical "L" state, the amount of gate-leak currents Ig of the NMOS transistor N1 should be sufficiently larger than the total amount of off-leak currents I1 between the source and drain of the PMOS transistor P1 and leak currents I2 between the gate of the PMOS transistor P2 and the semiconductor substrate (for example, a relation between Ig (max) in a case where the potential at the memory terminal Na is VDD and I1+I2 (max) in a case where the potential at the memory terminal Na is GND is Ig (max)>>I1+I2 (max)) and at least it is necessary to satisfy a relation of Ig>I1+I2 (conditional expression 1).

On the other hand, in order to stably hold the data of logical "H" at the memory terminal Na, it is desirable that the amount of gate-leak currents Ig of the NMOS transistor N1 should be sufficiently smaller than the amount of ON currents of the PMOS transistor P1. Though a standby current decreases as the gate-leak currents of the NMOS transistors N1 and N2 each become smaller, it is desirable that the gate-leak currents should be large in order to stably hold the data of "L" as discussed above and an optimum value of the gate-leak currents depends on a tradeoff between the stability of data holding and the standby current.

Thus, since only the PMOS transistors P1 and P2 are cross-connected to each other to form the memory cell storage unit 1, the first preferred embodiment achieves an SRAM having a structure to simplify a layout design and ensure reduction in cell area.

<The Second Preferred Embodiment>

FIG. 2 is a circuit diagram showing a structure of a memory cell storage unit in an SRAM in accordance with the second preferred embodiment of the present invention. A memory cell storage unit 2 shown in FIG. 2 is formed in the semiconductor substrate.

As shown in FIG. 2, compared with the memory cell storage unit 1 of the first preferred embodiment, the memory cell storage unit 2 has a structure in which the PMOS transistors and the NMOS transistors in the first preferred embodiment are replaced by each other (the PMOS transistors P1 and P2 are replaced by NMOS transistors N11 and N12 and the NMOS transistors N1 and N2 are replaced by PMOS transistors P11 and P12) and the power supply VDD and the ground potential GND are replaced by each other. Further, in the memory cell storage unit 2, a memory terminal Nd is connected to a drain of the NMOS transistor N11, a gate of the NMOS transistor N12 and a gate of the PMOS transistor P11, a memory terminal Ne is connected to a drain of the NMOS transistor N12, a gate of the NMOS transistor N11 and a gate of the PMOS transistor P12 and an internal terminal Nf is commonly connected to sources of the PMOS transistors P11 and P12.

The memory cell storage unit 2 having such a structure can produce the same effect as the memory cell storage unit 1 of the first preferred embodiment does.

<The Third Preferred Embodiment>

FIG. 3 is a circuit diagram showing a structure of a memory cell (memory circuit) in an SRAM in accordance with the third preferred embodiment of the present invention. A memory cell 3 shown in FIG. 3 is formed in the semiconductor substrate.

As shown in FIG. 3, an access port is additionally provided in the memory cell storage unit 1 of the first preferred embodiment to constitute the memory cell 3, to thereby achieve a read operation and a write operation of stored data in the memory cell storage unit 1, using the word lines (WL1, WL2) as write/read control lines and the bit lines (BL1, BL2) as write/read lines.

Specifically, a source of a PMOS transistor P3 as an access transistor is connected to the memory terminal Na, a drain thereof is connected to the bit line BL1 and a gate thereof is connected to the word line WL1, and further a source of a PMOS transistor P4 as an access transistor is connected to the memory terminal Nb, a drain thereof is connected to the bit line BL2 and a gate thereof is connected to the word line WL2. Accordingly, access memory terminals for the PMOS transistors P3 and P4 are the memory terminals Na and Nb, respectively.

Further, in the memory cell 3 of the third preferred embodiment, in order to stably hold the data of logical "L" at the memory terminal Na, assuming that a leak current between the source and drain of the PMOS transistor P3 is a current I3, it is necessary to satisfy a relation of Ig>I1+I2+I3 (conditional expression 2) at least during a period while the memory terminal Na is stable in the logical "L" state, and it is desirable that a relation between Ig (max) in a case where the potential at the memory terminal Na is VDD and I1+I2+I3 (max) in a case where the potential at the memory terminal Na is GND should be Ig (max)>>I1+I2+I3 (max).

Next, a read/write operation using the word line WL1 (WL2) and the bit line BL1 (BL2) will be discussed. When the word line WL1 is in the "H" state, the PMOS transistor P3 is in the OFF state and the memory terminal Na is electrically cut off with the bit line BL1 which corresponds to a read/write terminal of data. In other words, the stored data is held. When the word line WL1 is brought into the "L" state from the "H" state in response to an external signal, the PMOS transistor P3 comes into the ON state from the OFF state and the memory terminal Na electrically gets connected to the bit line BL1.

In this case, if the bit line BL1 is not externally driven, the data of the memory terminal Na is propagated to the bit line BL1 through the PMOS transistor P3 and read out. The above is the read operation in the read/write operation.

On the other hand, when the word line WL1 is in the "L" state, if the bit line BL1 is strongly driven into the "L" or "H" state by a not-shown external circuit, the data of the bit line BL1 which is driven is propagated to the memory terminal Na through the PMOS transistor P3 and data of the memory terminal Na is rewritten by the data of the bit line BL1. The above is the write operation in the read/write operation.

When the word line WL1 is returned to the "H" state from the "L" state by an external signal, the memory terminal Na comes into a hold-mode again. An operation of a port on the side of the PMOS transistor P4 connected to the memory terminal Nb is the same as the above operation and therefore not discussed.

As discussed above, the memory cell 3 of the third preferred embodiment can perform the read/write operation on the memory cell storage unit 1.

Further, since the write operation is performed with data set so that the bit lines BL1 and BL2 have a complementary relation and the read operation is performed on the basis of potential difference between the bit lines BL1 and BL2, a stable read/write operation can be achieved.

Normally, in many cases, an operation of the SRAM is performed with the word lines WL1 and WL2 commonly connected so that the bit lines BL1 and BL2 may have a complementary relation. No particular problem rises, however, even when the above ports (word lines WL1 and WL2) are operated independently of each other. In this case, an independent read/write operation can be performed in each of the two ports.

<The Fourth Preferred Embodiment>

FIG. 4 is a circuit diagram showing a structure of a memory cell in an SRAM in accordance with the fourth preferred embodiment of the present invention. A memory cell 4 shown in FIG. 4 is formed in the semiconductor substrate.

As shown in FIG. 4, an access port is additionally provided in the memory cell storage unit 2 of the second preferred embodiment to constitute the memory cell 4, to thereby achieve a read operation and a write operation of stored data in the memory cell storage unit 2, using the word lines (WL1, WL2) and the bit lines (BL1, BL2).

Specifically, a source of an NMOS transistor N13 as an access transistor is connected to the memory terminal Nd, a drain thereof is connected to the bit line BL1 and a gate thereof is connected to the word line WL1, and further a source of an NMOS transistor N14 as an access transistor is connected to the memory terminal Ne, a drain thereof is connected to the bit line BL2 and a gate thereof is connected to the word line WL2.

Next, a read/write operation using the word line WL1 (WL2) and the bit line BL1 (BL2) will be discussed. When the word line WL1 is in the "L" state, the NMOS transistor N13 is in the OFF state and the memory terminal Nd is electrically cut off with the bit line BL1 which corresponds to a read/write terminal of data. In other words, the stored data is held. When the word line WL1 is brought into the "H" state from the "L" state in response to an external signal, the NMOS transistor N13 comes into the ON state from the OFF state and the memory terminal Nd electrically gets connected to the bit line BL1.

In this case, if the bit line BL1 is not externally driven, the data of the memory terminal Nd is propagated to the bit line BL1 through the NMOS transistor N13 and read out. The above is the read operation in the read/write operation.

On the other hand, when the word line WL1 is in the "H" state, if the bit line BL1 is strongly driven into the "L" or "H" state by a not-shown external circuit, the data of the bit line BL1 which is driven is propagated to the memory terminal Nd through the NMOS transistor N13 and data of the memory terminal Nd is rewritten by the data of the bit line BL1. The above is the write operation in the read/write operation.

When the word line WL1 is returned to the "L" state from the "H" state by an external signal, the memory terminal Nd comes into a hold-mode again. An operation of a port on the side of the NMOS transistor N14 connected to the memory terminal Ne is the same as the above operation and therefore not discussed.

As discussed above, the memory cell 4 of the fourth preferred embodiment can perform the read/write operation on the memory cell storage unit 2.

Normally, in many cases, an operation of the SRAM is performed with the word lines WL1 and WL2 commonly connected so that the bit lines BL1 and BL2 may have a complementary relation. Like in the third preferred embodiment, however, no particular problem rises even when the above ports (word lines WL1 and WL2) are operated independently of each other.

<The Fifth Preferred Embodiment>

FIG. 5 is a circuit diagram showing a structure of a memory cell in an SRAM in accordance with the fifth preferred embodiment of the present invention. A memory cell 5 shown in FIG. 5 is formed in the semiconductor substrate.

As shown in FIG. 5, in the fifth preferred embodiment, an another access port is additionally provided in the memory cell 3 of the third preferred embodiment shown in FIG. 3 to constitute the memory cell 5, thereby achieving a read operation of stored data in the memory cell storage unit 1 using read word lines (RWL1, RWL2) as read only control lines and read bit lines (RBL1, RBL2) as read only lines.

Specifically, a source of an NMOS transistor N3 as an access transistor is connected to the drain of the NMOS transistor N1 which is the read terminal m1, a drain thereof is connected to the read bit line RBL1 and a gate thereof is connected to the read word line RWL1. On the other hand, a source of an NMOS transistor N4 as an access transistor is connected to the drain of the NMOS transistor N2 which is the read terminal m2, a drain thereof is connected to the read bit line RBL2 and a gate thereof is connected to the read word line RWL2. Accordingly, access read terminals for the NMOS transistors N3 and N4 are the memory terminals m1 and m2, respectively.

Next, a read operation using the read word line RWL1 (RWL2) and the read bit line RBL1 (RBL2) will be discussed. When the read word line RWL1 is in the "L" state, the NMOS transistor N3 is in the OFF state and the read terminal m1 is electrically cut off with the read bit line RBL1. In an initial state, the read bit line RBL1 is precharged in the "H" state, which is different from the "L" state defined by the ground potential GND, by a not-shown precharge circuit.

When the read word line RWL1 is brought into the "H" state from the "L" state in response to an external signal, the NMOS transistor N3 comes into the ON state from the OFF state and the read terminal m1 electrically gets connected to the read bit line RBL1. If the hold-mode of the memory terminal Na is "H", the NMOS transistor N1 is in the ON state and the read bit line RBL1 electrically gets connected to the ground potential GND which is a fixed potential through the NMOS transistors N3 and N1. Therefore, the read bit line RBL1 is brought into the "L" state from the "H" state and data of "L" which is inverted data of the memory terminal Na is read out.

Conversely, if the hold-mode of the memory terminal Na is "L" (the memory terminal Na is set to a potential to turn off at least the NMOS transistor N1), the NMOS transistor N1 is in the OFF state and the read bit line RBL1 is electrically cut off with the ground potential GND. Therefore, the read bit line RBL1 remains the "H" state and data of "H" which is inverted data of the memory terminal Na is read out. When the read word line RWL1 is returned to the "H" state from the "L" state by an external signal, the read terminal m1 gets cut off with the read bit line RBL1 again and the read bit line RBL1 is precharged into the "H" state again for the next read operation. Further, the read bit line RBL1 and the memory terminal Na are not electrically connected to each other and no write operation is performed by the NMOS transistor N3. In other words, the read operation of this port (RWL1, RBL1) has an advantage of being stably performed with no possibility of wrong writing caused by wrong inversion of the data at the memory terminal Na. A read operation of a port of the read terminal m2 is the same as the above operation and therefore not discussed.

Further, though the fifth preferred embodiment shows the case where one NMOS transistor N3 and one NMOS transistor N4 are connected to the read terminals m1 and m2, respectively, connecting a plurality of NMOS transistors, like the NMOS transistors N3 and N4, to each of the read terminals m1 and m2 allows easy addition of reading ports. A read operation of the additional ports can be performed in the same manner as above.

Normally, in many cases, an operation of the SRAM is performed with the word lines WL1 and WL2 commonly connected so that the bit lines BL1 and BL2 may have a complementary relation. No particular problem rises, however, even when the above ports (word lines WL1 and WL2) are operated independently of each other.

As discussed above, when the read word lines RWL1 and RWL2 are used for one read operation and the read bit lines RBL1 and RBL2 are operated as a pair of complementary bit lines (the read operation is performed on the basis of the potential difference between the read bit lines RBL1 and RBL2), if very small potential difference between the two read bit lines RBL1 and RBL2 is detected by using a differential sense amplifier, the read operation can be advantageously performed at higher speed.

Further, a read/write operation using the PMOS transistors P3 and P4 is the same as that in the third preferred embodiment and therefore not discussed.

As discussed above, the memory cell 5 of the fifth preferred embodiment can perform a read/write operation of data on the memory cell storage unit 1 and a stable read operation.

Further, since the fifth preferred embodiment achieves a multiport memory cell having four ports using eight transistors, the memory cell 5 of the fifth preferred embodiment has an advantage of reducing the number of transistors and the cell area as compared with the background-art four-port memory cell.

<The Sixth Preferred Embodiment>

FIG. 6 is a circuit diagram showing a structure of a memory cell in an SRAM in accordance with the sixth preferred embodiment of the present invention. A memory cell 6 shown in FIG. 6 is formed in the semiconductor substrate.

As shown in FIG. 6, in the sixth preferred embodiment, an another access port is additionally provided in the memory cell 4 of the fourth preferred embodiment to constitute the memory cell 6, thereby achieving a read operation of stored data in the memory cell storage unit 2 using the read word lines (RWL1, RWL2) and the read bit lines (RBL1, RBL2).

Specifically, a source of a PMOS transistor P13 as an access transistor is connected to the drain of the PMOS transistor P11 which is a read terminal m11, a drain thereof is connected to the read bit line RBL1 and a gate thereof is connected to the read word line RWL1. On the other hand, a source of a PMOS transistor P14 as an access transistor is connected to the drain of the PMOS transistor P12 which is a read terminal m12, a drain thereof is connected to the read bit line RBL2 and a gate thereof is connected to the read word line RWL2. Accordingly, access read terminals for the PMOS transistors P13 and P14 are the memory terminals m11 and m12, respectively.

A read operation on the memory cell 6 of the sixth preferred embodiment using the read word line RWL1

(RWL2) and the read bit line RBL1 (RBL2) is the same as the read operation on the memory cell 5 of the fifth preferred embodiment except that the PMOS transistors and the NMOS transistors are replaced by each other and the power supply VDD and the ground potential GND are replaced by each other and therefore not discussed.

Further, a read/write operation using the NMOS transistors N13 and N14 as ports is the same as that in the fourth preferred embodiment and therefore not discussed.

Therefore, the memory cell 6 of the sixth preferred embodiment, like the memory cell 5 of the fifth preferred embodiment, can perform a read/write operation of data in the memory cell storage unit 2 and a stable read operation.

Further, since the sixth preferred embodiment achieves a multiport memory cell having four ports using eight transistors, the memory cell 6 of the sixth preferred embodiment has an advantage of reducing the number of transistors and the cell area as compared with the background-art four-port memory cell.

<The Seventh Preferred Embodiment>

FIG. 7 is a circuit diagram showing a structure of a memory cell in an SRAM in accordance with the seventh preferred embodiment of the present invention. A memory cell 7 shown in FIG. 7 is formed in the semiconductor substrate. The memory cell 7 of the seventh preferred embodiment has a structure to serve as a content addressable memory (CAM).

As shown in FIG. 7, the gates of the PMOS transistors P3 and P4 are commonly connected to a word line WL. On the other hand, the drains of the NMOS transistors N3 and N4 are commonly connected to a match line ML1 as a comparison judgment line, the ate of the NMOS transistor N3 is connected to a search line SL1 as a comparison judgment control line and the gate of the NMOS transistor N4 is connected to a search line SL2 as a comparison judgment control line. Further, the sources of the NMOS transistors N3 and N4 are connected to the read terminals m1 and m2. Other structural features than the above are the same as those in the memory cell 5 of the fifth preferred embodiment.

Next, an operation of the memory cell 7 of the seventh preferred embodiment will be discussed. A read/write operation using the word line WL and the bit line BL1 (BL2) is the same as that of the memory cell 3 of the third preferred embodiment (except that the word lines WL1 and WL2 are provided independently in the third preferred embodiment) and therefore not discussed.

A comparison operation typical of the content addressable memory will be discussed. The comparison operation refers to an operation for checking if data stored in the memory cell storage unit matches search data. First in an initial state, the search lines SL1 and SL2 are driven into the "L" state by a not-shown driver circuit. Accordingly, the NMOS transistors N3 and N4 are in the OFF state and the read terminals m1 and m2 are electrically cut off with the match line ML1. In the initial state, the match line ML1 is precharged into the "H" state by a not-shown precharge circuit.

The comparison operation is performed by driving the search data to the search lines SL1 and SL2. For example, when comparison is performed to check if the hold-mode of the memory terminal Na is "H", in other words, if the hold-mode of the memory terminal Nb is "L", the search line SL1 is driven into the "L" state and the search line SL2 is driven into the "H" state.

Specifically, the search line SL1 remains the initial "L" state and the search line SL2 is brought into the "H" state from the "L" state. Then, the NMOS transistor N4 is brought into the ON state from the OFF state and the read terminal m2 is brought into electrical conduction with the match line ML1. Since the NMOS transistor N3 remains the OFF state, the read terminal m1 remains electrically cut off with the match line ML1. If the memory terminal Na is in the "L" state and the memory terminal Nb is in the "H" state, the NMOS transistor N1 is in the OFF state and the NMOS transistor N2 is in the ON state.

Accordingly, the match line ML1 is electrically connected to the ground potential GND through the NMOS transistors N4 and N2 to come into the "L" state from the "H" state, thereby reading out a result that the hold-mode of the memory terminal Na is not "H" (not matching).

Conversely, if the memory terminal Na is in the "H" state and the memory terminal Nb is in the "L" state, the NMOS transistor N1 is in the ON state and the NMOS transistor N2 is in the OFF state. Since the NMOS transistors N3. and N2 out of the NMOS transistors N1 to N4 are in the OFF state, the match line ML1 remains electrically cut off with the ground potential GND. Accordingly, the match line ML1 remains the initial "H" state, thereby reading out a result that the hold-mode of the memory terminal Na is "H" (matching).

On the other hand, when comparison is performed to check if the hold-mode of the memory terminal Na is "L". in other words, if the hold-mode of the memory terminal Nb is "H", the search line SL1 is driven into the "H" state and the search line SL2 is driven into the "L" state. The subsequent comparison operation is the same as the above and therefore not discussed.

The comparison operation in the content addressable memory can simultaneously check whether all the stored data in a plurality of cells (memory cell storage units 1) aligned in a row in a cell array match the search data or not. In this case, all the match lines of the cells aligned in a row are connected to one another. In the comparison operation for each cell, as discussed above, the match line is changed into "L" from "H" when not matching. In other words, if at least one cell among the cells aligned in a row does not match the search data, the match lines are changed into "L" from "H". Only when the comparison results of all the plurality cells aligned in a row indicate matching, the match lines remain "H".

In the comparison operation, either of the two search lines SL1 and SL2 is driven into "H". When the comparison operation is finished, both the search lines SL1 and SL2 are driven into the initial state "L" and the match line ML1 is precharged into the "H" state. Thus, the comparison operation is performed.

As discussed above, since the memory cell 7 serving as the content addressable memory is constituted of eight transistors in the seventh preferred embodiment, it is possible to reduce the number of transistors and the cell area as compared with the background-art memory cell serving as the content addressable memory.

<The Eighth Preferred Embodiment>

Figure 8:
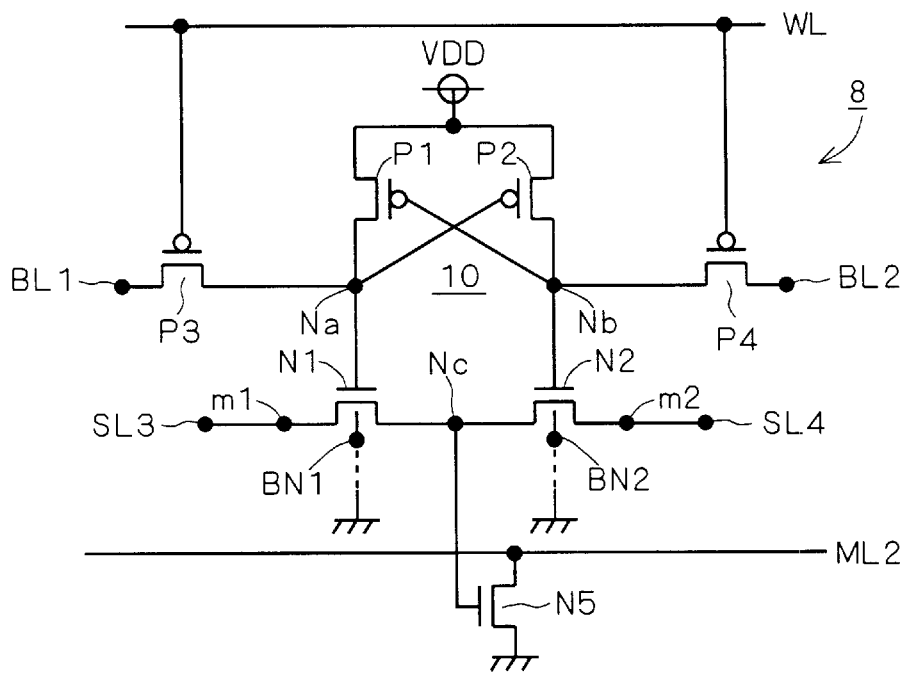
FIG. 8 is a circuit diagram showing a structure of a memory cell in an SRAM in accordance with an eighth preferred embodiment of the present invention.

FIG. 8 is a circuit diagram showing a structure of a memory cell in an SRAM in accordance with the eighth preferred embodiment of the present invention. A memory cell 8 shown in FIG. 8 is formed in the semiconductor substrate. The memory cell 8 of the eighth preferred embodiment has a structure to serve as a content addressable memory (CAM) like in the seventh preferred embodiment.

A memory cell storage unit 10 has the same structure as the memory cell storage unit 1 except that the internal terminal Nc is not set to the ground potential GND.

As shown in FIG. 8, the gates of the PMOS transistors P3 and P4 are commonly connected to the word line WL. On the other hand, a drain of an NMOS transistor N5 which replaces the NMOS transistors N3 and N4 is connected to a match line ML2 as a comparison judgment line, a gate thereof is connected to the internal terminal Nc and a source thereof is connected to the ground potential GND. The read terminal m1 is connected to a search line SL3 as a comparison judgment control line and the read terminal m2 is connected to a search line SL4 as a comparison judgment control line. Other structural features than the above are the same as those in the memory cell 5 of the fifth preferred embodiment.

Next, an operation of the memory cell 8 of the eighth preferred embodiment will be discussed. A read/write operation using the word line WL and the bit line BL1 (BL2) is the same as that of the memory cell 3 of the third preferred embodiment (except that the word lines WL1 and WL2 are provided independently in the third preferred embodiment) and therefore not discussed.

Then, a comparison operation typical of the content addressable memory will be discussed. First in an initial state, the search lines SL3 and SL4 are driven into the "L" state by a not-shown driver circuit. Accordingly, since the internal terminal Nc is initially in the "L" state by the NMOS transistor N1 or N2 in the ON state, the NMOS transistor N5 is in the OFF state.

The comparison operation is performed by driving the search data to the search lines SL3 and SL4, like in the seventh preferred embodiment. For example, when comparison is performed to check if the hold-mode of the memory terminal Na is "H", in other words, if the hold-mode of the memory terminal Nb is "L", the search line SL3 is driven into the "L" state and the search line SL4 is driven into the "H" state.

Specifically, the search line SL3 remains the initial "L" state and the search line SL4 is brought into the "H" state from the "L" state. If the memory terminal Na is in the "L" state and the memory terminal Nb is in the "H" state, the NMOS transistor N1 is in the OFF state and the NMOS transistor N2 is in the ON state.

Accordingly, the NMOS transistor N5 is brought into the ON state from the OFF state and the match line ML2 is electrically connected to the ground potential GND to change into "L" from "H", thereby reading out a result that the hold-mode of the memory terminal Nb is not "L" (not matching).

Conversely, if the memory terminal Na is in the "H" state and the memory terminal Nb is in the "L" state, the NMOS transistor N1 is in the ON state and the NMOS transistor N2 is in the OFF state. The internal terminal Nc is electrically connected to the search line SL3, remaining the "L" state.

Accordingly, since the NMOS transistor N5 remains the OFF state and the match line ML2 remains cut off with the ground potential GND, the match line ML2 remains the initial "H" state, thereby reading out a result that the hold-mode of the memory terminal Na is "H" (matching).

On the other hand, when comparison is performed to check if the hold-mode of the memory terminal Na is "L", in other words, if the hold-mode of the memory terminal Nb is "H", the search line SL3 is driven into the "H" state and the search line SL4 is driven into the "L" state. The subsequent comparison operation is the same as the above and therefore not discussed.

Thus, the memory cell 8 of the eighth preferred embodiment can perform the same comparison operation as the memory cell 7 of the seventh preferred embodiment.

As discussed above, since the memory cell 8 serving as the content addressable memory is constituted of seven transistors in the eighth preferred embodiment, it is possible to reduce the number of transistors and the cell area as compared with the background-art memory cell serving as the content addressable memory.

<The Ninth Preferred Embodiment>

Figure 9:
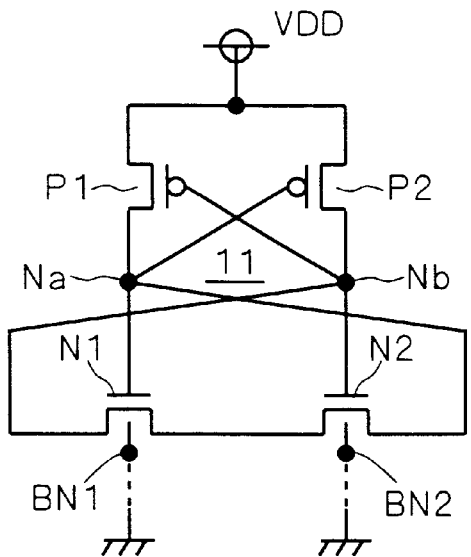
FIG. 9 is a circuit diagram showing a structure of a memory cell storage unit in an SRAM in accordance with a ninth preferred embodiment of the present invention.

FIG. 9 is a circuit diagram showing a structure of a memory cell storage unit in an SRAM in accordance with the ninth preferred embodiment of the present invention. A memory cell storage unit 11 shown in FIG. 9 is formed in the semiconductor substrate.

As shown in FIG. 9, the sources of the PMOS transistors P1 and P2 are connected to the power supply VDD. The drain of the PMOS transistor P1, the gate of the PMOS transistor P2 and the gate of the NMOS transistor N1 are commonly connected to the memory terminal Na. Further, the drain of the PMOS transistor P2, the gate of the PMOS transistor P1 and the gate of the NMOS transistor N2 are commonly connected to another memory terminal Nb. Sources of the NMOS transistors N1 and N2 are connected to each other.

Further, the drains of the NMOS transistors N1 and N2 are connected to the memory terminals Nb and Na, respectively. Potentials at backgate terminals BN1 and BN2 of the NMOS transistors N1 and N2 are set to the ground potential GND.

In an NMOS transistor, though the substrate potential is normally set to the ground potential GND as shown in FIG. 9, no particular problem rises when the substrate potential is externally set to another potential (e.g., a potential lower than the set potential GND). When the body potential is fixed, the substrate potential is connected to the ground potential GND or an arbitrary potential like in a bulk silicon wafer. With the above connection, a memory cell storage unit 11 of the ninth preferred embodiment is achieved.

Next, an operation of the memory cell storage unit 11 of FIG. 9 will be discussed. The memory terminals Na and Nb have a complementary relation, as discussed in the first preferred embodiment. Accordingly, when the memory terminal Na is stable in the logical "H" state (in other words, the memory terminal Nb is in the "L" state), the PMOS transistor P1 is in the ON state and the PMOS transistor P2 is in the OFF state. Further, the NMOS transistor N1 is in the ON state and the NMOS transistor N2 is in the OFF state.

As discussed in the first preferred embodiment, with the thinned gate insulating film of the MOS transistor, the gate-leak current flows from the gate of the NMOS transistor N1 to the semiconductor substrate, but since the PMOS transistor P1 is in the ON state, the memory terminal Na is electrically connected to the power supply VDD to hold the logical "H" state.

On the other hand, since the PMOS transistor P2 is in the OFF state, the memory terminal Bb is electrically cut off with the power supply potential VDD and remains the logical "L" state by the gate-leak current passing from the gate of the NMOS transistor N2 to the semiconductor substrate.

Further, in order to stably hold the data of logical "L" at the memory terminal Na, like in the first preferred embodiment, it is desirable that at least during the period while the memory terminal Na is stable in the logical "L" state, the amount of gate-leak currents Ig of the NMOS transistor N1 should be sufficiently larger than the total amount of off-leak currents I1 between the source and drain of the PMOS transistor P1 and leak currents I2 between the gate of the PMOS transistor P2 and the semiconductor substrate and at least it is necessary to satisfy the relation of Ig>I1+I2 (conditional expression 1).

On the other hand, in order to stably hold the data of logical "H" at the memory terminal Na, it is desirable that the amount of gate-leak currents Ig of the NMOS transistor N1 should be sufficiently smaller than the amount of ON currents of the PMOS transistor P1. Though a standby current decreases as the gate-leak currents of the NMOS transistors N1 and N2 each become smaller, it is desirable that the gate-leak currents should be large in order to stably hold the data of "L" as discussed above and an optimum value of the gate-leak currents depends on a tradeoff between the stability of data holding and the standby current.

Thus, since only the PMOS transistors P1 and P2 are cross-connected to each other to form the memory cell storage unit 11, the ninth preferred embodiment achieves an SRAM having a structure to simplify a layout design and ensure reduction in cell area.

Further, the memory cell storage unit 11 of the ninth preferred embodiment has an advantage of having a greater soft-error resistance than the memory cell storage unit 1 of the first preferred embodiment by additional gate-drain capacitances of the NMOS transistors N2 and N1 to the memory terminals Na and Nb, respectively.

<The Tenth Preferred Embodiment>

Figure 10:
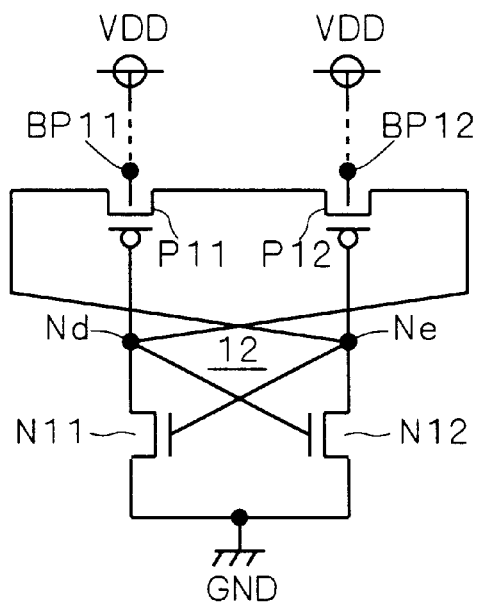
FIG. 10 is a circuit diagram showing a structure of a memory cell storage unit in an SRAM in accordance with a tenth preferred embodiment of the present invention.

FIG. 10 is a circuit diagram showing a structure of a memory cell storage unit in an SRAM in accordance with the tenth preferred embodiment of the present invention. A memory cell storage unit 12 shown in FIG. 10 is formed in the semiconductor substrate.

As shown in FIG. 10, the memory cell storage unit 12 is the same as the memory cell storage unit 11 of the ninth preferred embodiment except that the PMOS transistors and the NMOS transistors of the ninth preferred embodiment are replaced by each other (the PMOS transistors P1 and P2 are replaced by the NMOS transistors N11 and N12, and the NMOS transistors N1 and N2 are replaced by the PMOS transistors P11 and P12) and the power supply VDD and the ground potential GND are replaced by each other. The memory terminal Nd is connected to the drain of the NMOS transistor N11, the gate of the NMOS transistor N12, the gate of the memory terminal P11 and the drain of the PMOS transistor P12, and the memory terminal Ne is connected to the drain of the NMOS transistor N12, the gate of the NMOS transistor N11, the gate of the PMOS transistor P12 and the drain of the PMOS transistor P11. The sources of the PMOS transistors P11 and P12 are connected to each other.

The memory cell storage unit 12 of the tenth preferred embodiment having such a structure can produce the same effect as the memory cell storage unit 11 of the ninth preferred embodiment and has an advantage of having a greater soft-error resistance than the memory cell storage unit 2 of the second preferred embodiment.

<The Eleventh Preferred Embodiment>

FIG. 11 is a circuit diagram showing a structure of a memory cell storage unit in an SRAM in accordance with the eleventh preferred embodiment of the present invention. A memory cell storage unit 13 shown in FIG. 11 is formed in the semiconductor substrate.

As shown in FIG. 11, the memory cell storage unit 13 is different from the memory cell storage unit 11 of the ninth preferred embodiment shown in FIG. 9 in that the sources of the NMOS transistors N1 and N2 are not connected to each other and there are short circuits between the drain and source of the NMOS transistor N1 and between the drain and source of the NMOS transistor N2.

The memory cell storage unit 13 of the eleventh preferred embodiment having such a structure can produce the same effect as the memory cell storage unit 11 of the ninth preferred embodiment.

<The Twelfth Preferred Embodiment>

FIG. 12 is a circuit diagram showing a structure of a memory cell storage unit in an SRAM in accordance with the twelfth preferred embodiment of the present invention. A memory cell storage unit 14 shown in FIG. 12 is formed in the semiconductor substrate.

As shown in FIG. 12, the memory cell storage unit 14 is different from the memory cell storage unit 12 of the tenth preferred embodiment shown in FIG. 10 in that the sources of the PMOS transistors P11 and P12 are not connected to each other and there are short circuits between the drain and source of the PMOS transistor P11 and between the drain and source of the PMOS transistor P12.

The memory cell storage unit 14 of the twelfth preferred embodiment having such a structure can produce the same effect as the memory cell storage unit 12 of the tenth preferred embodiment.

<The Thirteenth Preferred Embodiment>

Figure 13:
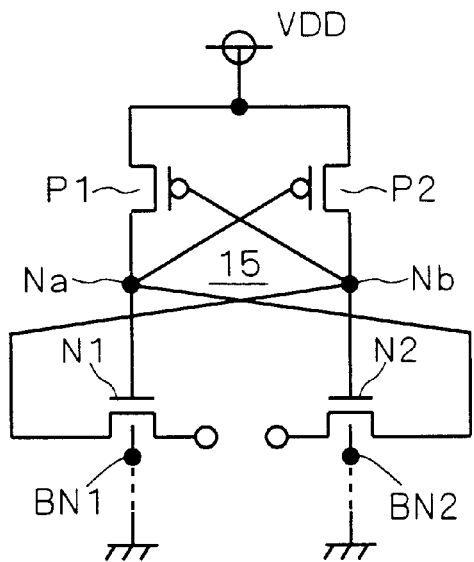
FIG. 13 is a circuit diagram showing a structure of a memory cell storage unit in an SRAM in accordance with a thirteenth preferred embodiment of the present invention.

FIG. 13 is a circuit diagram showing a structure of a memory cell storage unit in an SRAM in accordance with the thirteenth preferred embodiment of the present invention. A memory cell storage unit 15 shown in FIG. 13 is formed in the semiconductor substrate.

As shown in FIG. 13, the memory cell storage unit 15 is different from the memory cell storage unit 11 of the ninth preferred embodiment shown in FIG. 9 in that the sources of the NMOS transistors N1 and N2 are not connected to each other and these sources are each in a floating state (opened).

The memory cell storage unit 15 of the thirteenth preferred embodiment having such a structure can produce the same effect as the memory cell storage unit 11 of the ninth preferred embodiment.

<The Fourteenth Preferred Embodiment>

Figure 14:
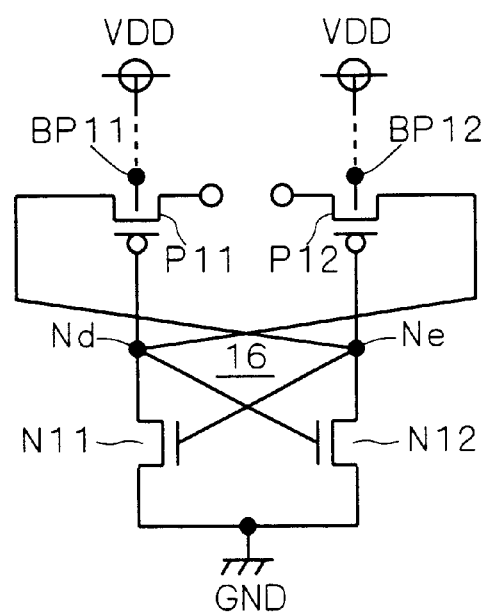
FIG. 14 is a circuit diagram showing a structure of a memory cell storage unit in an SRAM in accordance with a fourteenth preferred embodiment of the present invention.
Figure 15:
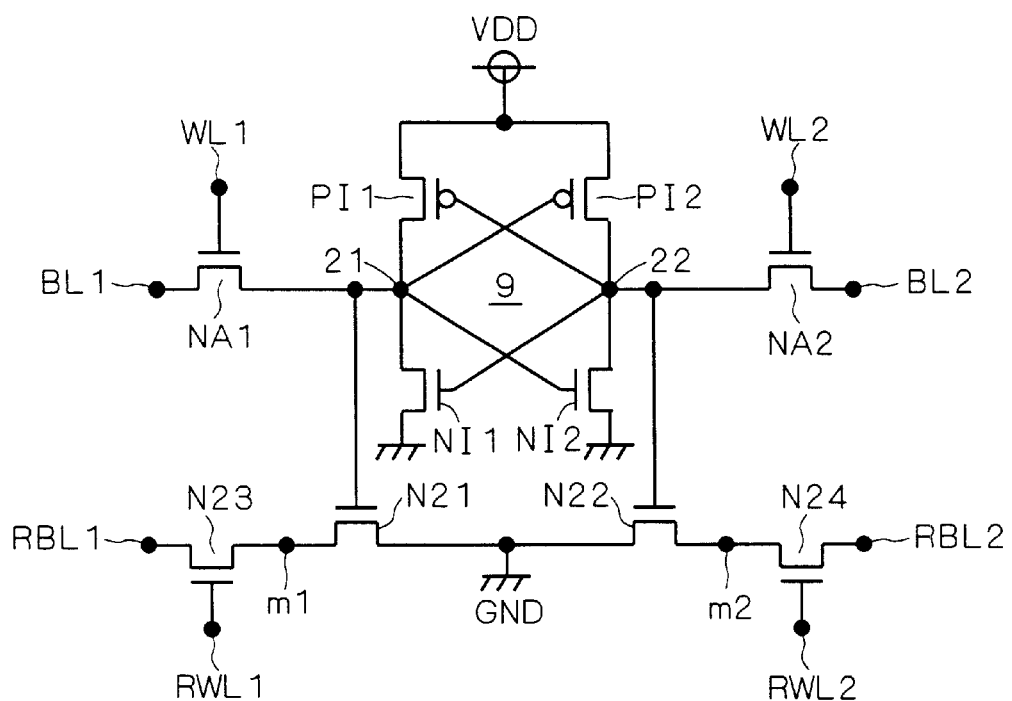
FIG. 15 is a circuit diagram showing an exemplary memory cell of multiport memory in the background art.

FIG. 14 is a circuit diagram showing a structure of a memory cell storage unit in an SRAM in accordance with the fourteenth preferred embodiment of the present invention. A memory cell storage unit 16 shown in FIG. 14 is formed in the semiconductor substrate.

As shown in FIG. 14, the memory cell storage unit 16 is different from the memory cell storage unit 12 of the tenth preferred embodiment shown in FIG. 10 in that the sources of the PMOS transistors P11 and P12 are not connected to each other and these sources are each in a floating state.

The memory cell storage unit 16 of the fourteenth preferred embodiment having such a structure can produce the same effect as the memory cell storage unit 12 of the tenth preferred embodiment.

<Others>

Though the PMOS transistors P3 and P4 are used as the access transistors for the read/write operation in the third, fifth, seventh and eighth preferred embodiments, NMOS transistors may be used instead. If the soft-error resistance should be improved, however, it is desirable to use the PMOS transistors.

Though the NMOS transistors N13 and N14 are used as the access transistors for the read/write operation in the fourth and sixth preferred embodiments, PMOS transistors may be used instead.

Though the NMOS transistors N3 and N4 are used as the access transistors connected to the read terminals m1 and m2 in the fifth and seventh preferred embodiments, it is better to use PMOS transistors instead. If the internal terminal Nc is set to the ground potential GND, however, it is desirable to use the NMOS transistors.

Though the PMOS transistors P13 and P14 are used as the access transistors connected to the read terminals m11 and m12 in the sixth preferred embodiment, it is better to use NMOS transistors instead. If the internal terminal Nf is set to the power supply VDD, however, it is desirable to use the PMOS transistors.

Further, though the memory cells of the fifth to seventh preferred embodiments are each constituted of eight MOS transistors, it is desirable that the memory cells should be each constituted of four NMOS transistors and four PMOS transistors in order to improve degree of integration.

In the first, third, fifth, seventh, eighth, ninth, eleventh and thirteenth preferred embodiments, it is possible to reduce the amount of leak currents to satisfy the above-discussed conditional expressions 1 and 2 by setting the potentials of the PMOS backgate terminals of the PMOS transistors P1 and P2 higher than the power supply VDD.

Similarly, in the second, fourth, sixth, tenth, twelfth and fourteenth preferred embodiments, it is possible to reduce the amount of leak currents to satisfy the above-discussed conditional expressions 1 and 2 by setting the potentials of the NMOS backgate terminals of the NMOS transistors N11 and N12 lower than the ground potential GND.

Furthermore, if the PMOS transistors P3 and P4 of the third preferred embodiment shown in FIG. 3 are additionally connected to the memory terminals Na and Nb of the memory cell storage units 11 in the ninth preferred embodiment, the memory cell storage unit 13 in the eleventh preferred embodiment and the memory cell storage unit 15 in the thirteenth preferred embodiment to form a memory cell, it is possible to achieve the same effect as that of the third preferred embodiment.

Similarly, if the NMOS transistors N13 and N14 of the fourth preferred embodiment shown in FIG. 4 are additionally connected to the memory terminals Na and Nb of the memory cell storage units 12 in the tenth preferred embodiment, the memory cell storage unit 14 in the twelfth preferred embodiment and the memory cell storage unit 16 in the fourteenth preferred embodiment to form a memory cell, it is possible to achieve the same effect as that of the fourth preferred embodiment.

Though the above first to fourteenth preferred embodiments show the cases where the MOS transistors are used as MIS transistors, naturally, the present invention can be achieved by using MIS transistors having the above-discussed characteristic features other than the MOS transistors.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device having a memory cell storage unit for data storage formed in a semiconductor substrate, said memory cell storage unit comprising:

first and second MIS transistors both of a first conductivity type, one electrode of said first MIS transistor and one electrode of said second MIS transistor being commonly connected to a first power supply, the other electrode of said first MIS transistor and the other electrode of said second MIS transistor serving as first and second memory terminals, respectively, said first and second memory terminals being connected to control electrodes of said second and first MIS transistors, respectively, said first and second memory terminals each being set to a first power supply judged-potential that can be judged as a potential on the side of said first power supply when said first and second MIS transistors are in an ON state; and third and fourth MIS transistors both of a second conductivity type, one electrode of said third MIS transistor and one electrode of said fourth MIS transistor being connected to each other, control electrodes of said third and fourth MIS transistors being connected to said first and second memory terminals, respectively, the other electrode of said third MIS transistor and the other electrode of said fourth MIS transistor being independent of said first and second memory terminals, backgate terminals of said third and fourth MIS transistors for setting a substrate potential being connected to a second power supply, wherein said first to fourth MIS transistors are provided so that a potential of said first memory terminal is stable at a second power supply judged-potential that can be judged as a potential on the side of said second power supply when said first MIS transistor is in an OFF state and a potential of said second memory terminal is stable at said second power supply judged-potential when said second MIS transistor is in the OFF state.

2. The semiconductor memory device according to claim 1, wherein assuming that currents flowing between one electrode and the other electrode of said first MIS transistor in the OFF state are first off-leak currents, currents flowing between one electrode and the other electrode of said second MIS transistor in the OFF state are second off-leak, currents flowing between said control electrode of said first MIS transistor and said semiconductor substrate are first gate-leak currents, currents flowing between said control electrode of said second MIS transistor and said semiconductor substrate are second gate-leak currents, currents flowing between said control electrode of said third MIS transistor and said semiconductor substrate are third gate-leak currents and currents flowing between said control electrode of said fourth MIS transistor and said semiconductor substrate are fourth gate-leak currents, said first to fourth MIS transistors ate provided so that the amount of said third gate-leak currents is not less than the total amount of said first off-leak currents and said second gate-leak currents during a period until at least said potential and the amount of said terminal becomes said second power supply judged-potential and the amount of said fourth gate-leak currents is not less than the total amount of said first off-leak currents and said and said first gate-leak currents during a period until at least said potential of said second memory terminal becomes said second power supply judged-potential.

3. The semiconductor memory device according to claim 1, further comprising:

a seventh MIS transistor having one electrode connected to a comparison judgment line, the other electrode set to a fixed potential and a control electrode connected to one electrode of said third MIS transistor and one electrode of said fourth MIS transistor; and first and second comparison judgment control lines connected to the other electrodes of said third and fourth MIS transistors, respectively.

4. The semiconductor memory device according to claim 1, wherein said first conductivity type includes a P-type conductivity, said second conductivity type includes an N-type conductivity, and a potential of said first power supply is higher than that of said second power supply.

5. The semiconductor memory device according to claim 1, wherein
said first conductivity type includes an N-type conductivity,
said second conductivity type includes a P-type conductivity, and
a potential of said first power supply is lower than that of said second power supply.

6. The semiconductor memory device according to claim 1, further comprising:
a first access transistor having one electrode connected to an access memory terminal which is one of said first and second memory terminals, the other electrode connected to a write/read line and a control electrode connected to a write/read control line.

7. The semiconductor memory device according to claim 6, wherein
said write/read line includes first and second write/read lines, and
said first access transistor includes
a fifth MIS transistor having one electrode connected to said first memory terminal and the other electrode connected to said first write/read line; and
a sixth MIS transistor having one electrode connected to said second memory terminal and the other electrode connected to said second write/read line.

8. The semiconductor memory device according to claim 7, wherein
said write/read control line includes first and second write/read control lines,
said fifth MIS transistor has a control electrode connected to said first write/read control line, and
said sixth MIS transistor has a control electrode connected to said second write/read control line.

9. The semiconductor memory device according to claim 1, wherein
one electrode of said third MIS transistor and one electrode of said fourth MIS transistor are set to a fixed potential.

10. The semiconductor memory device according to claim 9, wherein
said other electrodes of said third and fourth MIS transistors are defined as first and second read terminals, respectively,
said semiconductor memory device further comprising:
a seventh MIS transistor having one electrode connected to said first read terminal, the other electrode connected to a comparison judgment line and a control electrode connected to a first comparison judgment control line; and
an eighth MIS transistor having one electrode connected to said second read terminal, the other electrode connected to said comparison judgment line and a control electrode connected to a second comparison judgment control line.

11. The semiconductor memory device according to claim 9, wherein
said fixed potential includes a potential of one of said first and second power supplies.

12. The semiconductor memory device according to claim 9, wherein
said third and fourth MIS transistors include a MIS transistor which turns on/off when said potentials of said first and second memory terminals are said first/second power supply judged-potentials, respectively, and
said other electrodes of said third and fourth MIS transistors are defined as first and second read terminals, respectively,
said semiconductor memory device further comprising:
a second access transistor having one electrode connected to an access read terminal which is one of said first and second read terminals, the other electrode connected to a read only line and a control electrode connected to a read only control line.

13. The semiconductor memory device according to claim 12, wherein
said read only line includes first and second read only lines, and
said second access transistor includes
a seventh MIS transistor having one electrode connected to said first read terminal and the other electrode connected to said first read only line; and
an eighth MIS transistor having one electrode connected to said second read terminal and the other electrode connected to said second read only line.

14. The semiconductor memory device according to claim 13, wherein
said read only control line includes first and second read only control lines,
said seventh MIS transistor has a control electrode connected to said first read only control line, and
said eighth MIS transistor has a control electrode connected to said second read only control line.

15. A semiconductor memory device having a memory cell storage unit for data storage formed in a semiconductor substrate,
said memory cell storage unit comprising:
first and second MIS transistors both of a first conductivity type, one electrode of said first MIS transistor and one electrode of said second MIS transistor being commonly connected to a first power supply, the other electrode of said first MIS transistor and the other electrode of said second MIS transistor serving as first and second memory terminals, respectively, said first and second memory terminals being connected to control electrodes of said second and first MIS transistors, respectively, said first and second memory terminals each being set to a first power supply judged-potential that can be judged as a potential on the side of said first power supply when said first and second MIS transistors are in an ON state; and
third and fourth MIS transistors both of a second conductivity type, one electrode of said third MIS transistor and one electrode of said fourth MIS transistor not being fixed to any potential, control electrodes of said third and fourth MIS transistors being connected to said first and second memory terminals, respectively, the other electrode of said third MIS transistor and the other electrode of said fourth MIS transistor being connected to said second and first memory terminals, backgate terminals of said third and fourth MIS transistors for setting a substrate potential being connected to a second power supply,
wherein said first to fourth MIS transistors are provided so that a potential of said first memory terminal is stable at a second power supply judged-potential that can be judged as a potential on the side of said second power supply when said first MIS transistor is in an OFF state and a potential of said second memory terminal is stable at said second power supply judged-potential when said second MIS transistor is in the OFF state.

16. The semiconductor memory device according to claim 15, wherein
one electrode of said third MIS transistor and one electrode of said fourth MIS transistor are connected to each other.

17. The semiconductor memory device according to claim 15, wherein
one electrode and the other electrode of said third MIS transistor are connected to each other, and
one electrode and the other electrode of said fourth MIS transistor are connected to each other.

18. The semiconductor memory device according to claim 15, wherein
one electrode of said third MIS transistor and one electrode of said fourth MIS transistor are in a floating state.

19. The semiconductor memory device according to claim 15, wherein
said first conductivity type includes a P-type conductivity,
said second conductivity type includes an N-type conductivity, and
a potential of said first power supply is higher than that of said second power supply.

20. The semiconductor memory device according to claim 15, wherein
said first conductivity type includes an N-type conductivity,
said second conductivity type includes a P-type conductivity, and
a potential of said first power supply is lower than that of said second power supply.

* * * * *